United States Patent
Ohno et al.

(10) Patent No.: US 9,059,060 B2
(45) Date of Patent: Jun. 16, 2015

(54) IMAGE SENSOR INCLUDING AN IMAGE-SENSING ELEMENT REGION AND LOGIC CIRCUIT REGION AND MANUFACTURING METHOD THEREOF

(71) Applicant: Kabushiki Kaisha Toshiba, Tokyo (JP)

(72) Inventors: Hiroshi Ohno, Yokohama (JP); Osamu Fujii, Yokohama (JP); Masataka Shiratsuchi, Kawasaki (JP); Yoshinori Honguh, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 24 days.

(21) Appl. No.: 13/737,069

(22) Filed: Jan. 9, 2013

(65) Prior Publication Data

US 2013/0221474 A1    Aug. 29, 2013

(30) Foreign Application Priority Data

Feb. 29, 2012    (JP) .................. 2012-043391

(51) Int. Cl.
*H01L 31/00*    (2006.01)
*H01L 27/146*    (2006.01)

(52) U.S. Cl.
CPC ...... *H01L 27/14634* (2013.01); *H01L 27/1469* (2013.01); *H01L 27/1463* (2013.01); *H01L 27/14643* (2013.01)

(58) Field of Classification Search
USPC ............... 257/443, 448, 461, 466, E31.11, 257/E31.124, E31.13; 438/59, 60, 75
See application file for complete search history.

(56) References Cited

U.S. PATENT DOCUMENTS

| | | | |
|---|---|---|---|
| 8,101,974 B2 | 1/2012 | Ohno et al. | |
| 2004/0232494 A1* | 11/2004 | Nagano et al. | 257/382 |
| 2007/0108487 A1 | 5/2007 | Inoue et al. | |
| 2007/0267666 A1 | 11/2007 | Park et al. | |
| 2009/0146310 A1* | 6/2009 | Ohno et al. | 257/773 |
| 2011/0073923 A1 | 3/2011 | Tatani et al. | |

FOREIGN PATENT DOCUMENTS

| | | |
|---|---|---|
| JP | 2007-134581 | 5/2007 |
| JP | 2007-311803 | 11/2007 |
| JP | 2009-128539 | 6/2009 |

(Continued)

OTHER PUBLICATIONS

Hiroshi Ohno et al. "Optical Interference Effect on Chip's Temperature Distribution in the Optical Annealing Process", 16th IEEE International Conference on Advanced Thermal Processing of Semiconductors-RTP2008, pp. 1-4.

(Continued)

*Primary Examiner* — Tucker Wright
(74) *Attorney, Agent, or Firm* — Oblon, McClelland, Maier & Neustadt, L.L.P.

(57) ABSTRACT

According to one embodiment, an image sensor includes an image-sensing element region formed by arranging a plurality of image-sensing elements on a semiconductor substrate, and a logic circuit region formed in a region different from the image-sensing element region on the substrate and including a plurality of gate patterns. Further, dummy gate patterns are formed with a constant pitch on the image-sensing element region.

15 Claims, 4 Drawing Sheets

(56) References Cited

FOREIGN PATENT DOCUMENTS

| | | |
|---|---|---|
| JP | 2009-141075 | 6/2009 |
| JP | 2011-71347 | 4/2011 |
| JP | 2011-155248 | 8/2011 |

OTHER PUBLICATIONS

Hirofumi Sumi et al. "For the Better Image Quality of CMOS Image Sensor", Fundamentals Review vol. 3 No. 3 2010, pp. 44-51.

Office Action issued Feb. 3, 2015 in Japanese Patent Application No. 2012-043391 (with English translation).

* cited by examiner

Image Sensor Including an Image-Sensing Element Region and Logic Circuit Region and Manufacturing Method Thereof

CROSS-REFERENCE TO RELATED APPLICATIONS

This application is based upon and claims the benefit of priority from Japanese Patent Application No. 2012-043391, filed Feb. 29, 2012, the entire contents of which are incorporated herein by reference.

FIELD

Embodiments described herein relate generally to an image sensor including an image-sensing element region and logic circuit region and a manufacturing method thereof.

BACKGROUND

A CMOS image sensor has image-sensing elements configured to acquire an image signal from a subject and a logic circuit configured to perform an image processing operation that can be incorporated on the same chip by use of the same manufacturing process. This is effective in providing a compact structure. However, in the CMOS image sensor, the mean pitches of circuit patterns in an image-sensing element region and logic circuit region are different in the order of digits. Due to this, a problem that the quality of the image-sensing element is degraded tends to occur.

That is, since the mean pitches of the circuit patterns in the respective regions are greatly different, it is predicted that the temperature of the logic circuit region becomes higher than that of the image-sensing element region in an optical annealing process that is one of the manufacturing processes. This is because the pitch of gate conductors (GCs), which are circuit patterns of the logic circuit, is smaller than the incident wavelength and the light absorption rate becomes higher in comparison with that in the image-sensing element region.

If the temperature of the logic circuit region becomes higher than that of the image-sensing element region, heat transfers from the logic circuit region to the image-sensing element region due to thermal diffusion in a portion of the image-sensing element region that is close to the logic circuit region. As a result, temperature irregularities occur in the peripheral region of the image-sensing element region. Such temperature irregularities cause a variation in the characteristic of each image-sensing element and lead to degradation in the quality.

DETAILED DESCRIPTION

In general, according to one embodiment, an image sensor includes an image-sensing element region formed by arranging a plurality of image-sensing elements on a semiconductor substrate, and a logic circuit region formed in a region different from the image-sensing element region on the substrate and including a plurality of gate patterns. Further, dummy gate patterns are formed with a constant pitch on the image-sensing element region.

The present embodiment is explained below with reference to the drawings.

(First Embodiment)

Figure 1:
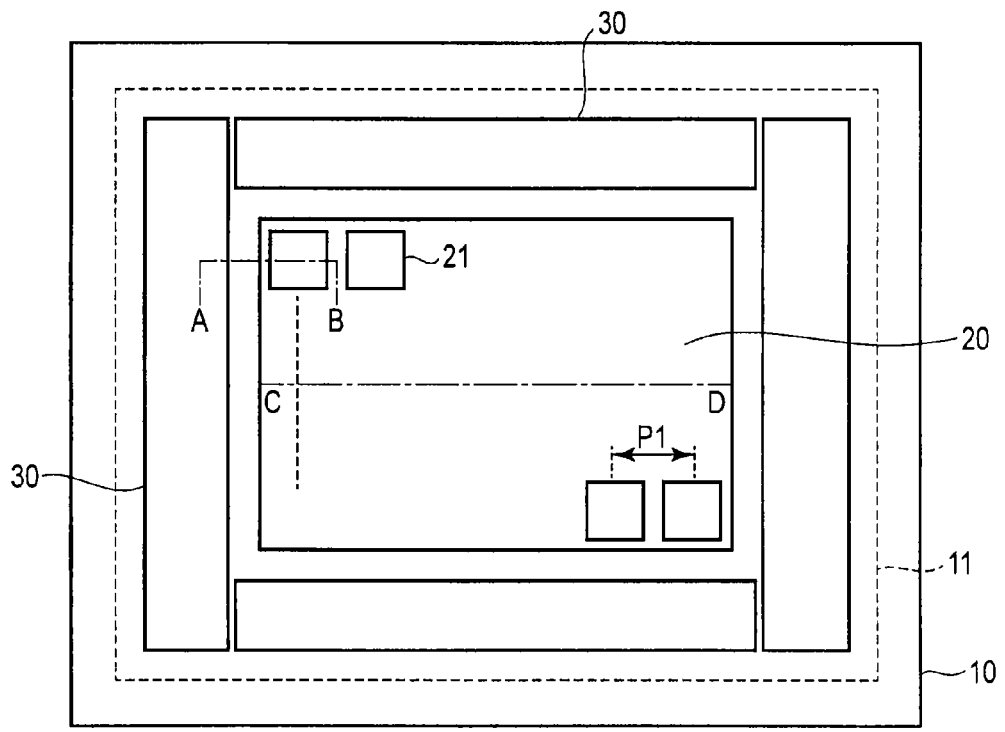
FIG. 1 is a top view of a chip showing an example of the circuit arrangement in a CMOS image sensor according to a first embodiment.

FIG. 1 is a plan view showing an example of the circuit arrangement in a CMOS image sensor according to a first embodiment. In FIG. 1, only one chip 11 that is one of a plurality of chips formed on a semiconductor substrate 10 is shown.

An image-sensing element region 20 is arranged on the semiconductor substrate 10 formed of Si or the like and a plurality of logic circuit regions 30 are arranged to surround the above region. The total area of one chip 11 is 10 mm×10 mm, for example. In the image-sensing element region 20, a plurality of image-sensing elements 21 are two-dimensionally arranged side by side at equal intervals. For example, the shape of the area of the image-sensing element 21 is a square with one side set to 5 μm. The distance between the centers of the image-sensing elements 21 is defined as pitch P1 of the image-sensing elements 21.

Figure 2:
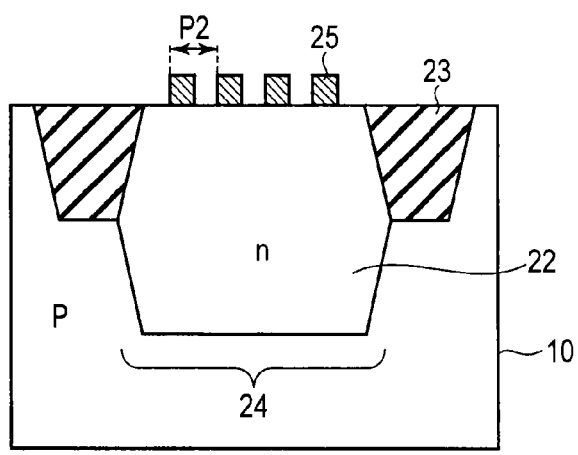
FIG. 2 is a cross-sectional view showing the structure of an image-sensing element region used in the CMOS image sensor of FIG. 1.

The image-sensing element 21 has the basic structure as shown in the cross-sectional view of FIG. 2 and includes shallow trench isolation (STI: element isolation) portions 23 formed of silicon oxide or the like and a photodiode 24 in the semiconductor substrate 10. For example, the semiconductor substrate 10 is of a p type. In the photodiode portion 24, an n type region 22 is formed in the surface portion of the substrate 10. Further, dummy GCs (dummy gate patterns) 25 are formed at equal intervals on the surface of the photodiode portion 24. The interval between the dummy GCs, more specifically, the distance between the centers of the adjacent dummy GCs or the distance between the left-side surfaces of the adjacent dummy GCs is defined as pitch P2 of the dummy GCs. For example, the dummy GC 25 is formed of poly Si and formed at the same time as formation of GCs of the logic circuit regions 30 that will be described later. The dummy gate GC 25 is formed with a pattern that is not associated with the circuit operation although the structure thereof is the same as that of the GC.

Figure 3:
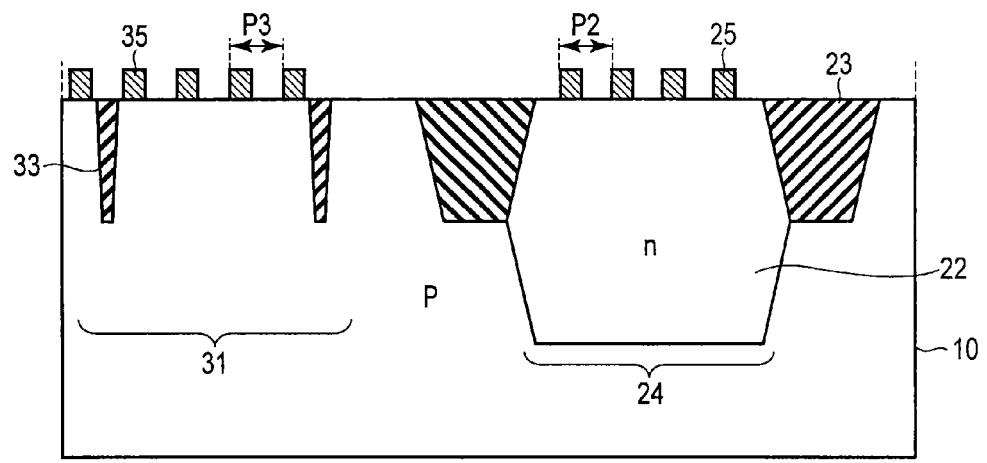
FIG. 3 is a cross-sectional view showing the structure of the image-sensing element region and logic circuit region used in the CMOS image sensor of FIG. 1.

The cross section taken along the line passing through A and B in the plan view of FIG. 1 is shown in FIG. 3. A logic circuit region 31 (a portion of the logic circuit region 30) includes STI (element isolation) portions 33, GCs 35 and circuit elements (diffusion layers for formation of various circuits or the like) (not shown). The GCs 35 are arranged at equal intervals. The interval between the GCs 35, more specifically, the distance between the centers of the adjacent GCs 35 or the distance between the left-side surfaces of the adjacent GCs 35 is defined as pitch P3 of the GCs 35. It is general to set pitch P3 of the GCs 35 in a range of 10 to 100 nm. However, pitch P3 of the GCs 35 is not necessarily set to an equal interval and GCs 35 having various pitches may be mixed together. In this case, the mean value of the pitches is defined as pitch P3 of the GCs 35. In this example, pitch P3 of the GCs 35 is set to 50 nm, for example.

With the above structure, the dummy GCs 25 are formed to set pitch P2 of the dummy GCs 25 equal to pitch P3 of the GCs 35. The dummy GC 25 is not connected to any circuit element and is made to float.

In the manufacturing method of the CMOS image sensor of this embodiment, first, STI portions 23, 33 formed of silicon oxide or the like are formed to surround the respective element regions in an image-sensing element region 20 and logic circuit regions 30 of a substrate 10. Then, impurities used for formation of n type regions are ion-implanted into the image-sensing element region 20.

Next, a poly Si film is formed on the entire surface with a gate insulating film disposed therebetween and is then processed. As a result, GCs 35 are formed on the logic circuit region 30 and dummy GCs 25 are formed on the image-sensing element region 20. Subsequently, impurities used for formation of CMOS transistors are ion-implanted into the logic circuit region 30.

By the process up to the above step, the structure shown in FIG. 3 is obtained. For formation of the dummy GCs 25, it is only necessary to add a dummy GC pattern to an exposure mask including a GC pattern and a new process for forming the dummy GCs 25 is not required.

Next, the diffusion layers or the like formed in the image-sensing element region 20 and logic circuit regions 30 are activated by subjecting the substrate surface portion to a heat treatment by using an optical annealing apparatus that will be described later. After this, necessary interconnections are formed after an interlayer insulating film is formed on the substrate surface, which completes a CMOS image sensor.

Figure 4:
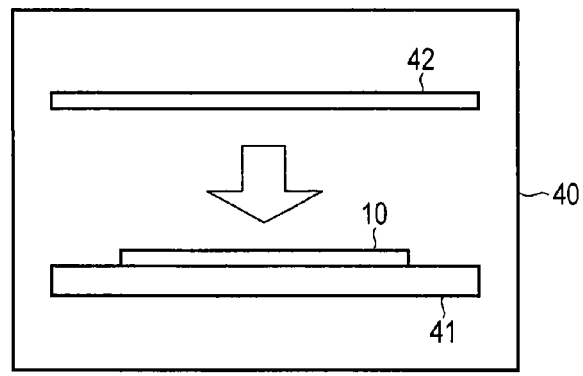
FIG. 4 is a cross-sectional view showing a schematic configuration of an optical annealing apparatus used for manufacturing the CMOS image sensor of the first embodiment.

FIG. 4 is a schematic configuration view showing an optical annealing apparatus used for manufacturing the CMOS image sensor of this embodiment.

A susceptor 41 used for placing the semiconductor substrate 10 thereon and a light source 42 for applying light to the surface of the substrate 10 are disposed in a chamber 40. The period of illumination of light by means of the light source 42 is set to several seconds or less. In the above light illumination condition, the surface temperature of the semiconductor substrate 10 instantly reaches a high temperature and the surface portion thereof is annealed.

As the optical annealing process, a spike rapid thermal annealing (RTA) process is used. At this time, for example, it is supposed that the light source 42 is a halogen lamp or has an intensity spectrum equivalent to that of a halogen lamp. A halogen lamp has an intensity spectrum between 3000 K and 3500 K at a temperature of black body radiation. In the following description, the wavelength of the spectrum is set to λ (for example, 1000 nm). Further, for example, the illumination period is set to several seconds and does not exceed 10 seconds.

Next, the operation and effect of this embodiment are explained.

In the manufacturing process of the CMOS image sensor, an annealing process is required to activate the diffusion layer. This embodiment is featured in that the annealing process is performed in the state of FIG. 3.

In FIG. 3, pitch P3 of the GCs 35 of the logic circuit region 31 is 50 nm and is sufficiently shorter than incident wavelength λ. At this time, the light absorption rate is increased by 10 to 20% in comparison with that of the semiconductor substrate 10 due to the light interference effect. Further, the light absorption rate is approximately determined according to pitch P3.

It is necessary to set mean pitch P1 in the image-sensing element region 20 larger than the wavelength region of visible light when taking the light-reception sensitivity (which is almost proportional to the area of the image-sensing element) into consideration and the pitch is generally set to 0.5 μm or more. On the other hand, it is more preferable for the mean pitch in the logic circuit (the pitch of GCs) to be set smaller in the absence of the above restriction. At present, mean pitch P3 in the logic circuit is generally set to approximately 30 to 100 nm.

Thus, the mean pitches in the image-sensing element region 20 and logic circuit region 30 are different from each other by one digit or more. It is known that the light absorption rate becomes higher in comparison with a case wherein the pitch is longer than the incident wavelength if pitch P3 of the GCs 35 is shorter than the incident wavelength. As a result, it is considered that the light absorption rate becomes higher in the logic circuit region 30 in which the pitch is shorter than the incident wavelength and the light absorption rate becomes lower in the image-sensing element region 20 in which the pitch is longer than the incident wavelength.

When no dummy GCs 25 are provided, the light absorption rate in the image-sensing element region 20 is almost equal to that in the semiconductor substrate 10. Therefore, the light absorption rate when no dummy GCs 25 are provided becomes higher in the logic circuit region 30 than in the image-sensing element region 20 by approximately 10 to 20%. At this time, the temperature distribution becomes high in the logic circuit region 30 and becomes low in the image-sensing element region 20. In practice, when the surface temperature of a portion taken along the line passing through C and D in the top view of the chip of FIG. 1 is calculated, the temperature distribution of FIG. 5 is obtained.

Figure 5:
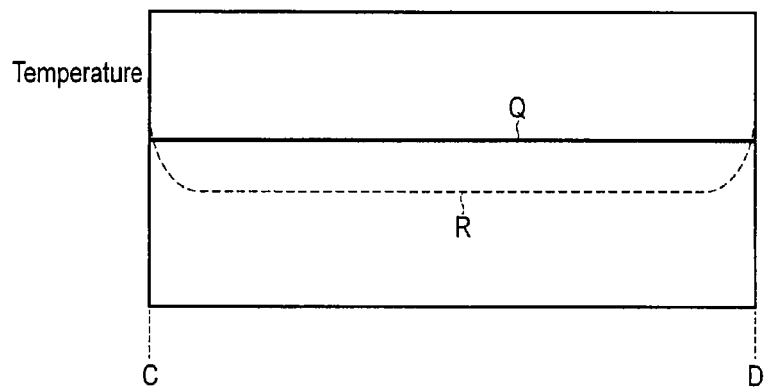
FIG. 5 is a characteristic diagram showing the temperature distribution in the image-sensing element region when the structure of FIG. 3 is subjected to optical annealing.

In FIG. 5, the abscissa indicates a position on CD and the ordinate indicates a temperature. In the drawing, a case where no dummy GCs 25 are provided is indicated by dotted lines R and a case where the dummy GCs 25 are provided is indicated by solid line Q.

As is clearly shown in FIG. 5, it is understood that the temperatures become high in portions near the C point and D point that are the end portions of the image-sensing element region 20 when no dummy GCs 25 are provided. However, it is understood that the temperature becomes uniform when the dummy GCs 25 are provided. This is because the light absorption rate becomes uniform in the logic circuit region 30 and in the image-sensing element region 20 by setting pitch P2 of the dummy GCs 25 equal to pitch P3 of the GCs 35.

Thus, in this embodiment, temperature irregularities in the peripheral portion of the image-sensing element region 20 can be reduced by setting pitch P2 of the dummy GCs 25 provided on the image-sensing element region 20 equal to pitch P3 of the GCs 35. Therefore, a variation in the element characteristic caused by the temperature irregularities can be suppressed and the product quality can be enhanced. Additionally, since the dummy GCs 25 can be formed at the same time as formation of the GCs 35 of the logic circuit region 30, it is unnecessary to newly provide a manufacturing process.

The thickness of the dummy GC 25 is as thin as approximately 100 nm and there is almost no possibility that an incident light amount in the photodiode portion 24 will be reduced due to formation of the dummy GC 25. On the other hand, since the light absorption rate in the photodiode 24 becomes higher due to formation of the dummy GCs 25, the sensitivity of the photodiode may be enhanced. This is a very beneficial effect for the image-sensing element.

Further, as a method for reducing the temperature irregularities in the peripheral portion of the image-sensing element region 20, it is considered to form fine rough portions on the surface of an image-sensing element by X-ray lithography to form a reflection-preventing structure. However, if a reflection-preventing film structure is provided by X-ray lithography, the manufacturing cost and manufacturing time are increased. Further, in the X-ray lithography, it is difficult to control the thickness of rough portions and it is difficult to form rough portions having optimum thickness. On the other hand, in this embodiment, since it is only required to form the dummy GCs 25 at the same time as formation of the GCs 35 without providing a new process, the manufacturing cost and manufacturing time will not be increased.

(Second Embodiment)

Figure 6:
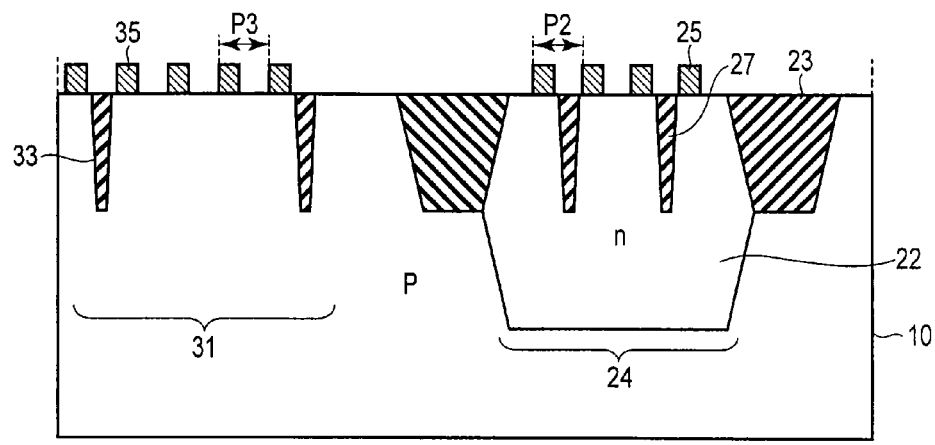
FIG. 6 is a cross-sectional view showing the structure of an image-sensing element region and logic circuit region used in a CMOS image sensor of a second embodiment.

FIG. 6 is a cross-sectional view showing the structure of an image-sensing element region and logic circuit region used in a CMOS image sensor of a second embodiment. Portions that are the same as those of FIG. 3 are denoted by the same symbols and a detailed explanation thereof is omitted.

This embodiment is attained by providing dummy STI (dummy element isolation) portions in the image-sensing element region 20 in addition to the structure of the first embodiment described before. That is, a dummy STI portion 27 is formed in each photodiode portion 24 in the image-sensing element region 20. The dummy STI portion 27 can be formed at the same time as formation of other STI portions 23, 33. Further, the pitch of the dummy STI portions 27 is not particularly limited, and may be set to almost the same value as the pitch of the STI portions 33 in the logic circuit region 30, for example.

In this embodiment, the structure of the substrate surface of the image-sensing element region 20 becomes closer to that of the logic circuit region 30 than in the first embodiment. Therefore, the light absorption rates in the image-sensing element region 20 and in the logic circuit region 30 can be set further closer to each other. As a result, temperature irregularities in the image-sensing element region 20 can be further reduced. Further, since the dummy STI portion 27 formed in the photodiode portion 24 is transparent with respect to visible light to be sensed, incident light reaches a deeper part of the photodiode portion 24. This leads to enhancement in the sensitivity of the photodiode portion 24.

(Third Embodiment)

Figure 7:
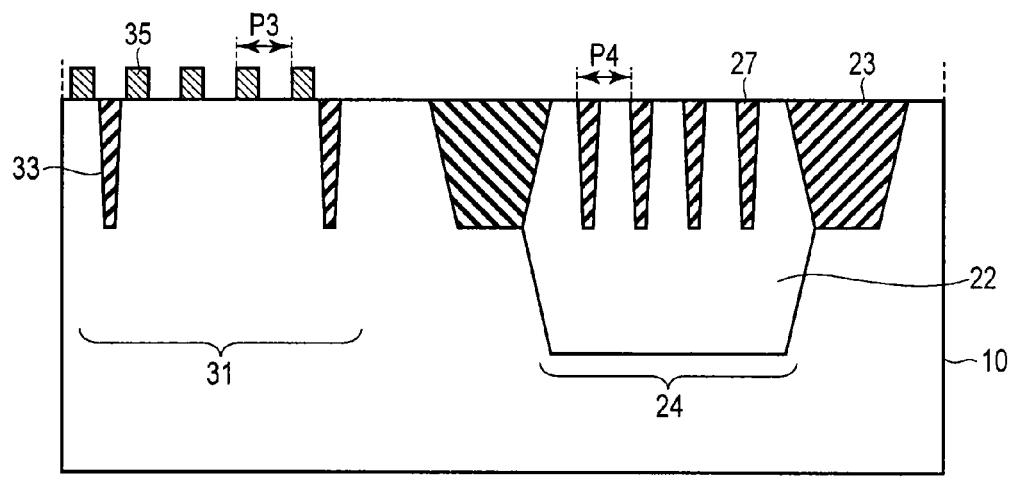
FIG. 7 is a cross-sectional view showing the structure of an image-sensing element region and logic circuit region used in a CMOS image sensor of a third embodiment.

FIG. 7 is a cross-sectional view showing the structure of an image-sensing element region and logic circuit region used in a CMOS image sensor of a third embodiment. Portions that are the same as those of FIG. 3 are denoted by the same symbols and a detailed explanation thereof is omitted.

This embodiment is different from the first embodiment in that dummy STI portions 27 are formed instead of providing the dummy GCs 25 on the image-sensing element region 20. That is, the dummy STI portions 27 are arranged at equal intervals in the photodiode portion 24. It is supposed that pitch P4 of the dummy STI portions 27 is sufficiently smaller than the pitch of STI portions 33 in a logic circuit region 30. For example, it is set to the same as pitch P3 of GCs 35 of the logic circuit region 30.

The light absorption rate can be raised not only by narrowing the pitch of the GCs but also by narrowing the pitch of the STI portions. Therefore, the light absorption rate can be raised in the image-sensing element region 20 and can be set closer to the light absorption rate in the logic circuit region 30 by narrowing pitch P4 of the dummy STI portions 27 in the image-sensing element region 20.

Thus, according to this embodiment, the temperature difference between the image-sensing element region 20 and the logic circuit region 30 can be suppressed in optical annealing by providing the dummy STI portions 27 in the image-sensing element region 20. Therefore, temperature irregularities in the image-sensing element region 20 can be reduced and variations in the element characteristics can be suppressed to enhance the product quality. Since the dummy STI portions can be formed at the same time as formation of the respective STI portions 23, 33 of the image-sensing element region 20 and the logic circuit region 30, it is not necessary to additionally provide a new manufacturing process. Further, since a large number of STI portions 27 are formed in the photodiode portion 24, an advantage that the sensitivity in the photodiode portion 24 is further enhanced can be achieved.

(Modification)

This invention is not limited to the above embodiments. The optical annealing apparatus is not limited to the structure shown in FIG. 4 and any apparatus can be used if it can realize optical annealing within several seconds or less. Further, the annealing method is not limited to the spike RTA and flash lamp annealing (FLA), laser spike annealing (LSA) or the like can be used.

In the above embodiment, pitch P2 of the dummy gate patterns in the image-sensing element region is set equal to pitch P3 of the gate patterns in the logic circuit region, but it is not necessary to set the pitches strictly equal to each other. It is most desirable to set the pitches to the same value, but it is possible to attain an effect of increasing the light absorption rate in the image-sensing element region and setting the same closer to that in the logic circuit region as long as pitch P2 of the dummy gate patterns is not set much wider than pitch P3 of the gate patterns. Further, the dummy gate pattern is not necessarily formed of the same material as that of the gate pattern of the logic circuit region and a material having a refractive index that is close to that of the gate pattern may be used and may be single crystalline Si, for example.

Further, in the above embodiment, an example applied to the CMOS image sensor is explained, but it is not limited to the CMOS image sensor. For example, an image sensor having an image-sensing element region and logic circuit region arranged on the same chip can be similarly applied. Further, the logic circuit region is not necessarily formed to surround the peripheral portion of the image-sensing element region and is sufficient if it is arranged close to the image-sensing element region.

Further, the manufacturing methods for the respective portions of the image-sensing element region and logic circuit region are not restricted at all. An optical annealing process may be performed in a state in which the gate patterns of the logic circuit region and the dummy gate patterns of the image-sensing element region are formed as shown in FIG. 3 and FIG. 6 or a state in which the gate patterns of the logic circuit region and the dummy element isolation portions of the image-sensing element region are formed as shown in FIG. 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An image sensor, comprising:
a semiconductor substrate;
a logic circuit region, formed on the substrate, the logic circuit region including a plurality of gate patterns;
an image-sensing element region formed in a region different from the logic circuit region on the substrate, a plurality of image-sensing elements being formed in the image-sensing element region and a plurality of dummy gate patterns formed with a constant pitch on the image-sensing element region; and
dummy element isolation portions in the image-sensing element region.

2. The image sensor of claim 1, wherein the pitch of the dummy gate patterns is equal to a pitch of the gate patterns of the logic circuit region.

3. The image sensor of claim 1, wherein the pitch of the dummy gate patterns is equal to a mean pitch of the gate patterns of the logic circuit region.

4. The image sensor of claim 1, wherein the logic circuit region includes element isolation portions together with the gate patterns and a pitch of the dummy element isolation portions is equal to a pitch of the element isolation portions of the logic circuit region.

5. The image sensor of claim 4, wherein the logic circuit region is formed to surround the image-sensing element region.

6. The image sensor of claim 1, wherein the logic circuit region is formed to surround the image-sensing element region.

7. The image sensor of claim 1, wherein the dummy gate patterns have the same structure as the gate patterns of the logic circuit region, but does not contribute to a circuit operation.

8. An image sensor, comprising:
a semiconductor substrate;
a logic circuit region, formed on the substrate, the logic circuit region including a plurality of gate patterns and element isolation portions; and
an image-sensing element region formed in a region different from the logic circuit region on the substrate, a plurality of image-sensing elements being formed in the image-sensing element region and dummy element isolation portions formed with a constant pitch in the image-sensing element region,
wherein the pitch of the dummy element isolation portions is smaller than a mean pitch of the element isolation portions of the logic circuit region.

9. The image sensor of claim 8, wherein the pitch of the dummy element isolation portions is equal to a pitch of the gate patterns of the logic circuit region.

10. The image sensor of claim 8, wherein the logic circuit region is formed to surround the image-sensing element region.

11. The image sensor of claim 8, further comprising a plurality of dummy gate patterns formed with a constant pitch on the image-sensing element region.

12. The image sensor of claim 11, wherein the pitch of the dummy gate patterns is equal to a pitch of the gate patterns of the logic circuit region.

13. The image sensor of claim 11, wherein the pitch of the dummy gate patterns is equal to a mean pitch of the gate patterns of the logic circuit region.

14. An image sensor, comprising:
a semiconductor substrate;
a logic circuit region, formed on the substrate, the logic circuit region including a plurality of gate patterns; and
an image-sensing element region formed in a region different from the logic circuit region on the substrate, a plurality of image-sensing elements being formed in the image-sensing element region and a plurality of dummy gate patterns formed with a constant pitch on the image-sensing element region,
wherein the pitch of the dummy gate patterns is equal to a pitch of the gate patterns of the logic circuit region.

15. An image sensor, comprising:
a semiconductor substrate;
a logic circuit region, formed on the substrate, the logic circuit region including a plurality of gate patterns; and
an image-sensing element region formed in a region different from the logic circuit region on the substrate, a plurality of image-sensing elements being formed in the image-sensing element region and a plurality of dummy gate patterns formed with a constant pitch on the image-sensing element region,
wherein the pitch of the dummy gate patterns is equal to a mean pitch of the gate patterns of the logic circuit region.

* * * * *